United States Patent [19]

Bourke et al.

[11] Patent Number: 4,717,996
[45] Date of Patent: Jan. 5, 1988

[54] GATED PARALLEL POWER SWITCHING DEVICES PROTECTION CIRCUIT

[75] Inventors: Robert F. Bourke, Fairchild; David L. Layden, New Lisbon; Richard I. Cook, Wisconsin Rapids, all of Wis.

[73] Assignee: Best Power Technology, Inc., Necedah, Wis.

[21] Appl. No.: 3,066

[22] Filed: Jan. 14, 1987

[51] Int. Cl.⁴ .................................... H02H 7/122
[52] U.S. Cl. .............................. 363/56; 307/584; 323/223; 361/56
[58] Field of Search .............. 307/577, 584; 323/223, 323/231; 361/54, 56; 363/55, 56

[56] References Cited

U.S. PATENT DOCUMENTS 4,487,457 12/1984 Janutka ........................ 307/577

Primary Examiner—Patrick R. Salce
Assistant Examiner—Jeffrey Sterrett
Attorney, Agent, or Firm—Michael Piontek

[57] ABSTRACT

Two or more gated type power switches, particularly mosfets, are disclosed in a protection circuit which protects the other power switches should one of them short to its respective gate. The circuit includes elements for sensing the occurrence of the failure, for carrying or diverting excess current from the gates, and increasing the impedance of the gates to minimize any damage. The circuit prevents the failure of one mosfet in a drain to gate short mode from destroying or damaging the other parallel mosfets. The invention results in easier analysis and repair of any damage should a breakdown occur, and for the first time makes practical the use of many mosfets in parallel for power switching applications.

23 Claims, 1 Drawing Figure

GATED PARALLEL POWER SWITCHING DEVICES PROTECTION CIRCUIT

DESCRIPTION

This invention relates to a circuit for gated, electronic switching devices, and more particularly to a circuit to protect parallel connected mosfets, or the like, from extensive damage due to a drain to gate failure of one of the parallel mosfets.

BRIEF DESCRIPTION OF THE PRIOR ART

Certain electronic switching devices are capable of being used in parallel to increase the current carrying capacity of the apparatus into which they are incorporated, as for example in a converter, inverter, or an AC power supply. Thus, for example an inverter with a one kilowatt rating may use one switching device on each side for each respective half cycle, while a three kilowatt rated inverter would use three switching devices in parallel per side. Conceivably a large number of switching devices could be used in parallel on each of the two sides of the inverter. However, if certain types of gated switching devices are used, such as mosfets, heretofore, it was impractical to put more than one or at most a few devices on a side in an inverter. The reason such construction was impractical was that should one of the mosfets fail in a drain to gate short mode, it almost certainly caused all or many of the other mosfets on that side to also fail due to the high voltages and current loads imposed by the short. The extensive failure of all or many mosfets on a side required extensive diagnosis and repair, for not only the mosfet that first failed in the drain to gate mode had to be replaced, but all the other mosfets that failed on that side also had to be located and replaced. Since perhaps 95% of all mosfet failures are in the form of a drain to gate short, putting more than, one or a few, mosfets on a side was impractical. Heretofore, there was no known method to limit or minimize damage to just the first mosfet that failed with the drain to gate short. While mosfets had other advantages which made them very attractive for adaptation to inverters, or the like power apparatus, this multiple failure phenomenon made it disadvantageous to parallel mosfets in inverters or other power apparatus to obtain larger power ratings.

SUMMARY OF THE PRESENT INVENTION

The circuit of the present invention has overcome this disadvantage so that with the use of the present invention, it now becomes practical to use a large number of mosfets, or other suitable gated switching devices, in parallel. In fact, using the circuit of the present invention it has been possible to provide in an inverter eight mosfets, parallel connected, on a side, without extensive damage should any one of the mosfets fail in a drain to gate short mode. The circuit of the present invention for use with two or more mosfets or the like in parallel, comprises a sensing means for sensing a voltage increase, such as would occur in a drain to gate failure of one of the mosfets, current carrying means operated by said sensing means and connected across the gates and sources of the parallel mosfets, said current carrying means turning on when any one of said mosfets fails, and current limiting means connected to the gate of each of said mosfets, said current limiting means diminishing the current flow due to the failed mosfet, drain to gate.

Preferably, said sensing means is the form of a Zener diode responsive to the voltage increase resulting at the gate of said one mosfet when it fails; said current carrying means is a SCR or the like, triggered by said sensing means; and said current limiting means is a variable impedance which automatically increases in impedance, such as a positive temperature coefficient (PTC) resistor. Preferably, said current limiting means has normally a low impedance, but is capable of developing a high impedance, upon the failure of one of said mosfets. While one current carrying means and one sensing means need be provided per side of the power inverter, the current limiting means could be replicated for each mosfet used in parallel, each mosfet having a thermistor (PTC) on its gate. An additional current limiting means could also be provided for the gate drive circuit.

It is in an object of the present invention to provide in a group of paralleled mosfets or the like devices used for power switching, a practical way to limit the failure to the first failed mosfet or like device.

A further object of the present invention is to provide protection for the drive circuit for the power switching devices.

Another object of the present invention is to provide a parallel mosfet circuit which minimizes damage should one of the parallel mosfets fail.

Another object of the present invention is to provide a circuit to detect failure at the gate of one power switching device and to provide an alternative current carrying path away from the gates of the other power switching devices, while also rapidly increasing the impedance in the gate paths.

These and other objects of the circuit of the present invention will become apparent from the following written description and accompanying figure of the drawing wherein:

DESCRIPTION OF THE PREFERRED EMBODIMENT

Figure 1:
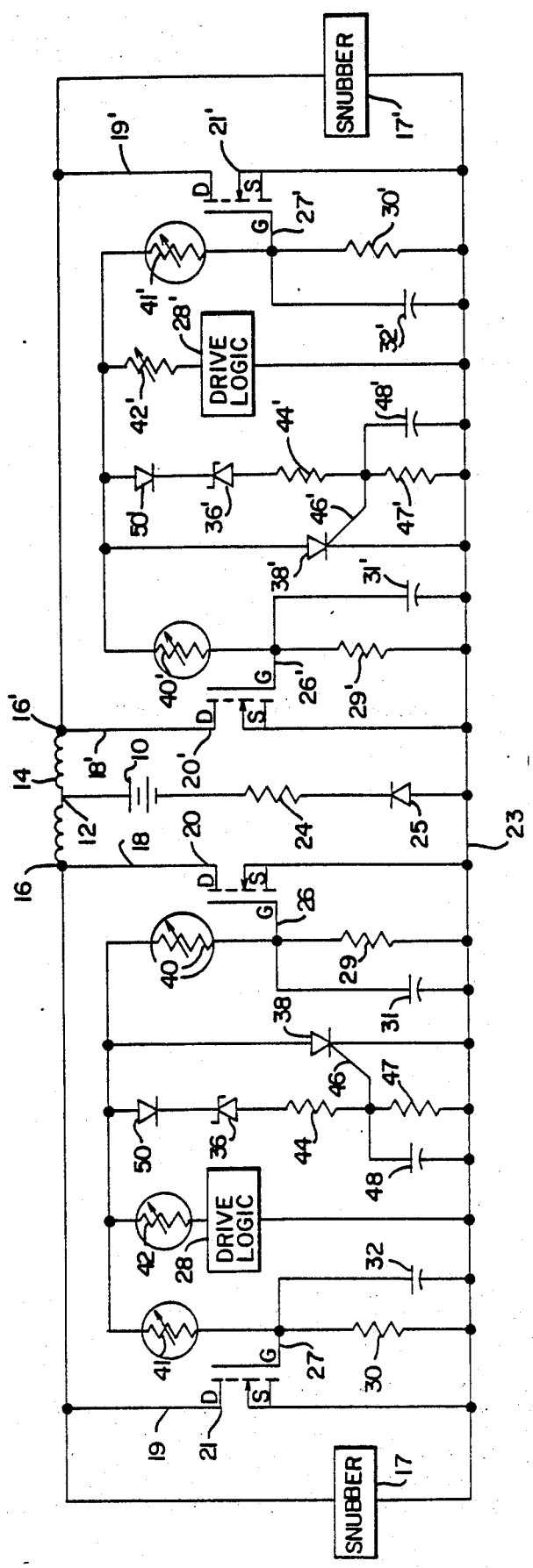
FIG. 1 is a schematic drawing of an inverter utilizing the circuit of the present invention with two parallel gated power switching devices, in this instance mosfets, per side being illustrated.

Referring to the drawing, for purposes of illustrating the invention an inverter has been shown and includes a battery 10, having its plus (+) terminal connected to a center tap 12 of a transformer winding 14. The two end taps 16 and 16' of the winding 14 are connected via conductors 18 and 18', to one side of power switching devices (solid state power switches) 20 and 20'. The other sides of the power switching devices 20 and 20' are connected to a common bus or ground 23. In order to increase the rating and current capacity of the inverter a second set of power switching devices 21 and 21' are connected in parallel with the respective devices 20 and 20'. One terminal of the switching devices 21 and 21' is connected by conductors 19 and 19' to the end taps 16 and 16' with the other terminals being connected to the common bus 23. The negative (−) terminal of the battery 10 is connected through a shunt resistor 24 and a diode 25 to the common bus 23. The shunt resistor 24 is not part of this invention, and is used to generate a signal which is utilized in the drive circuit for the power switching devices. The diode 25 is part of a battery anti-charge circuit which is used to keep the battery from being charged from the AC line and is known in the art. Of course, as is conventional, the transformer would have other windings (not shown), such as one for the load to be powered, and if the inverter forms part of a stand-by or a uninterruptable power supply, an additional winding for the AC line. Likewise, as is conventional, each side of the inverter would be provided with a snubber 17 or 17′ connected in parallel with the respective power switch devices 20 and 21 or 20′ and 21′.

As the two sides of the inverter are identical and only operate on different halves of the cycle, only one side, the left of FIG. 1, will be further described. It should be understood as described above the prime number components are similar to the unprime number components, except that they are on the right side of the inverter. The remaining unprime number components will now be described.

Preferably the switching devices 20, and 21 are mosfets. While only two are shown on a side, it should be known and understood that a greater number can be used. In fact applicants have already successfully built inverters using eight mosfets as power switches on each side, or a total of 16 mosfets used as power switches. The gates 26 and 27 of the mosfets 20 and 21 are connected as will be further described to a gate drive circuit 28. As is conventional the gate of the mosfet 20 or 21 is connected to the bus 23 by a resistor 29 or 30 and capacitor 31 or 32 in parallel.

Heretofore, the use of more than one mosfet on a side in a power apparatus, such as a inverter or converter, could result in extensive breakdowns should a failure occur. The extensive damage is due to the fact that generally the power circuit in which the battery operates is isolated from and operated at a substantially higher voltage than the drive circuit for the gates of the mosfets. For example, the battery may generate 48 volts, while the gate drive circuit operates at 15 volts. Normally there is no problem, as in a mosfet the gate is isolated from the drain. Should the mosfet fail in its most common mode, that being a drain to gate short, the substantially higher battery voltage of 48 volts is now imposed on the gate drive circuit. This can result in the destruction of the drive circuit and also any parallel connected mosfets. For example, without the present invention, if mosfet 20 shorted drain to gate, mosfet 21 is also likely to be destroyed. For this reason mosfets have not been used in parallel configurations in these type power switching applications.

To mimimize such damage to both the mosfets and the gate drive circuit, the circuit of the present invention has been developed and comprises sensing means 36 for detecting the failure of one or more of the parallel, gated power switching device, e.g., mosfet 20 or 21, current carrying or conducting means 38 for diverting or draining off excess current supplied by the battery through the failed gate to prevent that excess current from being imposed on the other gates and the drive logic circuit 28, and impedance increasing means 40, 41 and/or 42 for rapidly increasing the impedance of the gate of the failed mosfet 20 or 21, and if desired also the gate drive logic circuit 28.

As is shown in FIG. 1, the sensing means 36, preferably, comprises a Zener diode having its cathode connected between the output of the gate drive logic circuit 28 and the gates 26 and 27 of the mosfets 20 and 21, the anode of the Zener diode eventually being connected to the common bus 23. The Zener diode is chosen so that its breakdown voltage is above the maximum voltage of the gate drive circuit, preferably several or more volts above that voltage, but below the voltage of power circuit in which the battery 10 is contained and below the rupture voltage of the gates (40 to 50 volts). Thus, if the gate drive output voltage remains within its normal range, no mosfet failure signal is sensed. However, if the voltage to the gate increases above the normal level, as it would were the battery voltage (48 volts) imposed due to a drain to gate failure (short of one of the mosfets), the Zener breakdown voltage would be exceeded and a voltage developed (signal sensed) at the anode of the Zener diode. The sensed signal from the Zener diode is lead through a current limiting resistor 44 to the gate 46 of the SCR forming the current conducting means 38 hereinafter described. As is conventional, the gate of this SCR is connected by a resistor 47 and capacitor 48 in parallel with each other, both being in series with the current limiting resistor 44. Resistor 47 and capacitor 48 provide noise immunity for the gate of the SCR, as is conventional.

With respect to the sensing means 36, should the gate drive circuit generate both positive and negative voltage pulses, it will be desirable to install an additional diode 50 with its anode connected to the gates of the mosfets and its cathode connected to the cathode of the Zener diode 36. This diode 50 rectifies the gate drive logid output signal being sensed by the Zener diode to isolate the latter from any negative voltage component of the drive logic circuit 28.

As is shown in FIG. 1, the SCR 38 forming the current carrying means has its anode indirectly connected to the gates of the mosfets, while its cathode is connected to the common bus 23. Thus, when the Zener diode's 36 breakdown voltage is exceeded, the SCR 38 is fired to rapidly draw off any current flowing through the gate of the shorted mosfet 20 or 21, protecting the other mosfet 21 or 20 (or mosfets) and the drive logic circuit 28.

To further protect the mosfets and drive logic circuit, impedance increasing means is provided, and comprises, in this instance positive temperature coefficient (PTC) resistors 40, 41 and 42. These PTC resistors normally have a low impedance, but are quickly able to increase that impedance by at least several orders of magnitude. These PTC resistors are provided in the output of the gate drive logic circuit, itself, and just before the gate of each of the mosfets 20 and 21. Thus, should one of those mosfets 20 or 21 short, the sudden increase in current from the battery through the failed mosfet's gate would cause a rapid increase in impedance (resistance) of its associated PTC resistor to quickly and greatly diminish the current flow to the mosfet gates and drive logic circuit. Further, should the drive logic circuit continue, at least momentarily, its PTC resistor will also increase in impedance to provide protection. Further, resistor 44 and capacitor 48 are selected to provide a shorter time constant than resistor 40 (or 41) and capacitor 31 (or 32) to insure SCR 38 turns on quickly before any damage can occur.

For purposes of completeness the values of the components illustrated in FIG. 1 are set forth below for a typical 5 kilowatt rated inverter.

Mosfet 20, 20′, 21 and 21′: MTM4N20
Resistor 24: 250 amps. at 50 mv shunt
Resistor 29, 29′ 30 and 30′: 1 meg ohm
Resistor 44 and 44′: 10 ohms
Resistor 47 and 47′: 200 ohms PTC Resistor 40, 41, 42, 40' 41' and 42': 10 ohm at 70° C. up to 10K ohm in 50 millisecs and/or 250 milliamps
Diode 25: IR150K10A
Zener Diode 36 and 36': 22 Volt breakdown, 1 watt
Capacitor 31, 31' 32 and 32': 0.0047 microfarads
Capacitor 48, 48': 0.01 microfarads
SCR 38, 38': 2N6505
Battery Voltage: 48 Volts
Drive Logic Circuit Voltage: +18 volts (on) −12 volts (off)

In operation should one of the mosfets in one side of the inverter fails, the inverter will of course cease operation, but extensive damage to that side of the inverter will be prevented. Though a failure of one mosfet occurs, the gate drive circuit and the other mosfet (or mosfets) on that side will be protected, mimimizing damage and making repair easier, less expensive and more quickly completed. Thus, this circuit now makes it feasible to put more than one, and in fact, many gated power switching devices, such as mosfets, on each of the two sides of an inverter or the like.

While this present invention has been described with power switching devices in the form of mosfets, it should be understood that the invention could be used with other such gated switching devices which exhibit a drain to gate failure. Further, while the mosfets shown are N channel type, the present invention could be used with P channel types. While an inverter is shown with two gated, power switching devices per side, it should be understood that numerous parallel, gated power switches could be used on a side and/or incorporated in another type power apparatus, such as a converter or stand-by or uninterruptible power supply. While PTC resistors have been shown, it should be understood that the current limiting or impedance changing means could be of any other type device which exhibits a low impedance in a normal state but rapidly develops an impedance of several orders of magnitude higher. While the sensing means shown is a Zener diode, other type sensing means could be used. Similarly while the current carrying means is illustrated as an SCR, other conducting type devices could also be used. While battery voltage is shown as 48 v, it should be understood that the power circuit may see an instantaneous voltage several times higher. Even a lower voltage power circuit could see such higher voltage instantaneously. The term "higher voltage" is used in this sense in the claims. While only the preferred embodiment of gated, parallel power switching devices protection circuit of the present invention has been illustrated and described, from the foregoing, it should be further understood that variations, modifications, equivalent structures and steps fall within the scope of the appended claims.

What is claimed is:

1. In a power switching apparatus having a power circuit and a drive logic circuit, said power circuit operating at a higher voltage than said drive logic circuit, the improvement comprising two or more power switches in parallel in said power circuit, each of said power switches being of the type having a gate and subject to failure wherein the power switch gate shorts to said power circuit, said power switch gates being connected in common, said drive logic circuit being connected to said power switch gates, sensing means connected to said power switch gates for sensing the occurance of a power switch gate short, current carrying means for carrying away excess current from said power switch gates, said current carrying means being connected to said power switch gates, said sensing means operting said current carrying means when a power switch gate short occurs, and variable impedance means connected to said power switch gates for increasing the impedance of the power switch gates from a low value to at least an order of magnitude higher upon the occurrence of said power switch gate short, whereby should one of the gates of said power switches short, the other power switch will be protected from failure.

2. In a power switching apparatus as in claim 1, wherein said impedance means also increases the impedance of said drive logic circuit.

3. In a power switching apparatus as in claim 1, wherein said sensing means is connected at one end to said power switch gates and said drive logic circuit, said apparatus having a common bus, and said other end of said sensing means being connected to said common bus.

4. In a power switching apparatus as in claim 3, wherein said sensing means further comprises a Zener diode having a breakdown voltage above the normal voltage of said drive logic circuit but below that of said power circuit.

5. In a power switching apparatus as in claim 3, wherein said power switches are mosfets.

6. In a power switching apparatus as in claim 1, wherein said current carrying means further comprise an SCR, the gate of said SCR being operated by said sensing means.

7. In a power switching apparatus as in claim 6, wherein said sensing means is a Zener diode, the cathode of said Zener diode being connected to said power switch gates, and the anode of said Zener diode being connected to the gate of said SCR.

8. In a power switching apparatus as in claim 6, wherein said power switches are mosfets.

9. In a power switching apparatus as in claim 1, wherein said sensing means further comprises a Zener diode having a breakdown voltage above the normal voltage of said drive logic circuit but below that of said power circuit and the rupture voltage of said power switch gates.

10. In a power switching apparatus as in claim 9, wherein said power switches are mosfets.

11. In a power switching apparatus is in claim 1, wherein said power switches are mosfets.

12. In a power switching apparatus as in claim 1, wherein said variable impedance means is a thermistor with a positive temperature coefficient.

13. In a power switching apparatus as in claim 12, wherein at least one thermistor is connected into each of the gates of said power switches.

14. In a power switching apparatus as in claim 13, wherein another thermistor is connected between the output of said drive logic circuit and said power switch gates, whereby said drive logic circuit is further protected from failure.

15. In a power switching apparatus as in claim 12, wherein said power switches are mosfets.

16. In a power switching apparatus as in claim 1, wherein said power switching apparatus forms an inverter having two sides, with at least two power switches in parallel, one of said sensing means and one of said current carrying means being provided for each side of the inverter.

17. In a power switching apparatus having a power circuit and a drive logic circuit, said power circuit operating at a higher voltage than said drive logic circuit, the improvement comprising two or more power switches in parallel, said power switches being of the type having a gate and subject to failure wherein the gate shorts to the power circuit, said power switch gates being connected in common, said drive logic circuit being connected to said power switch gates for operating the latter, sensing means connected to said power switch gates for sensing the power switch gate short, said sensing means being connected at one end to said power switch gates and said drive logic circuit, said apparatus having a common bus, and said other end of said sensing means being connected to said common bus, said sensing means including a Zener diode having a breakdown voltage above the normal voltage of said drive logic circuit, current carrying means for carrying away excess current from said power switch gates, said current carrying means being connected to said power switch gates and said common bus, said current carying means including an SCR, the gate of said SCR being operated by said sensing means when the power switch gate short occurs, and variable impednace means connected to said power switch gates for increasing the impedance of the power switch gates from a low value to at least an order of magnitude higher upon the occurrence of the power switch gate short, said variable impedance means being a thermistor with a positive temperature coefficient, at least one thermistor being connected into each of the gates of said power switches, and another thermistor being connected between the output of the drive logic circuit and said gates of said power switches, whereby should one of the gates of said power switches fail, the other power switch and drive circuit will be protected from failure.

18. In a power switching apparatus as in claim 17, wherein said power switches further comprises mosfets, said mosfets having their gates connected in common and to said drive logic circuit, said SCR having its anode connected to said mosfet gates, and the gate of said SCR being connected to the cathode of said Zener diode.

19. In a power switching apparatus as in claim 18, wherein said apparatus further comprises an inverter having two sides, with at least two power switches in parallel, one of said sensing means and one of said current carrying means being provided for each side of the inverter.

20. In a power switching apparatus as in claim 17, wherein said apparatus comprises an inverter having two sides, each side having at least two power switches in parallel, one of said sensing means and one of said current carrying means being provided on each side of the inverter.

21. A method for protecting a power apparatus having a power circuit and a drive logic circuit with two or more power switches in parallel in said power circuit, each of said power switches being of the type having a gate and subject to failure wherein the power switch gate shorts to said power circuit, said power switch gates being connected in common, and said drive logic circuit being connected to said power switch gates to operate the same, said power circuit operating at a higher voltage than said drive logic circuit, comprising the steps of: sensing the occurrence of a power switch gate short, carrying away excess current from said power switch gate short away from the other power switch gate, and increasing the impedance of the shorted power switch gate from a low value to at least an order of magnitude higher upon the occurrence of said power switch gate short, whereby should one of the gates of said power switches short, the other power switch will be protected from failure.

22. The method of claim 21, comprising the further step of increasing the impedance of said drive logic circuit.

23. A method for protecting an inverter having a power circuit and a drive logic circuit, including two or more gated mosfets in parallel in said power circuit, said mosfet gates being connected in common, said drive logic circuit being connected to said mosfet gates for operating the latter, said power circuit operating at a higher voltage than said drive logic circuit, comprising the steps of: sensing the gate short of one of the mosfets, carrying away excess current from shorted mosfet gate, increasing the impedance of the shorted mosfet gate from a low value to at least an order of magnitude higher upon the occurrence of the mosfet gate short, and increasing the impedance of the drive logic circuit, whereby should one of the gates of the mosfets fail, the other mosfet and drive logic circuit will be protected from failure.

* * * * *